(12) United States Patent
Bardash

(10) Patent No.: US 10,651,240 B2
(45) Date of Patent: May 12, 2020

(54) SOLID STATE TISSUE EQUIVALENT DETECTOR WITH GATE ELECTRODES

(71) Applicant: Michael Bardash, Brooklyn, NY (US)

(72) Inventor: Michael Bardash, Brooklyn, NY (US)

(*) Notice: Subject to any disclaimer, the term of this patent is extended or adjusted under 35 U.S.C. 154(b) by 0 days.

(21) Appl. No.: 16/156,568

(22) Filed: Oct. 10, 2018

(65) Prior Publication Data

US 2019/0109179 A1    Apr. 11, 2019

Related U.S. Application Data

(60) Provisional application No. 62/570,735, filed on Oct. 11, 2017.

(51) Int. Cl.
| | | |
|---|---|---|
| *H01L 27/30* | (2006.01) | |
| *H01L 51/42* | (2006.01) | |
| *G01T 1/02* | (2006.01) | |
| *H01L 51/00* | (2006.01) | |
| *G01T 1/24* | (2006.01) | |

(52) U.S. Cl.
CPC ........... *H01L 27/308* (2013.01); *G01T 1/026* (2013.01); *G01T 1/24* (2013.01); *H01L 51/0035* (2013.01); *H01L 51/428* (2013.01); *H01L 51/0037* (2013.01)

(58) Field of Classification Search
CPC ............... H01L 27/308; H01L 51/0037; H01L 51/0035; H01L 51/428; G01T 1/24; G01T 1/026
See application file for complete search history.

(56) References Cited

U.S. PATENT DOCUMENTS

| | | | |
|---|---|---|---|
| 8,350,225 B1* | 1/2013 | Bardash | H01L 27/305 250/370.07 |
| 2016/0195573 A9* | 7/2016 | Murata | H01L 27/14665 250/208.1 |
| 2017/0062508 A1* | 3/2017 | Na | H01L 27/1443 |
| 2017/0110678 A1* | 4/2017 | Zang | G01N 27/4141 |
| 2018/0120938 A1* | 5/2018 | Frescas | G06F 1/163 |

* cited by examiner

*Primary Examiner* — Sitaramarao S Yechuri
(74) *Attorney, Agent, or Firm* — Stoyanov Law PLLC; Roy L. Chan

(57) ABSTRACT

An organic semiconductor detector for detecting radiation has an organic conducting active region, an output electrode and a field effect semiconductor device. The field effect semiconductor device has a biasing voltage electrode and a gate electrode. The organic conducting active region is connected on one side to the field effect semiconductor device and is connected on another side to the output electrode.

22 Claims, 3 Drawing Sheets

SOLID STATE TISSUE EQUIVALENT DETECTOR WITH GATE ELECTRODES

CROSS-REFERENCE TO RELATED APPLICATIONS

The present application claims priority to provisional U.S. patent application Ser. No. 62/570,735, filed Oct. 11, 2017, and entitled "Solid State Tissue Equivalent Radiation Detector Improvement," the disclosure of which is incorporated herein by reference in its entirety.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention concerns a novel type of a Solid State Tissue Equivalent Detectors (SSTEDs) that combines semiconductor device construction principles and organic photoconductor technology. The detector is an improvement on the invention disclosed in U.S. Pat. No. 8,350,225, which is hereby incorporated by reference in its entirety, issued to the same inventor. The invention is a solid state device that has an active region made of organic material; the entire device (with the exception of the electrical contacts) can be composed of organic material; it is small and lightweight; will operate at a relatively low voltage; and, will have a tissue equivalent response based on its constituent organic components.

The device is an improvement on the device presented in U.S. Pat. No. 8,350,225 with a modification introducing new electrodes. The new electrodes effectively make regions of the device, which are connected to the active region, act like Field Effect Transistors (FETs). The new electrodes act like gate regions of a standard FET and create field effect within regions of the device. Field effect refers to the modulation of the electrical conductivity of a material by the application of an external electric field. Thus, when the device is at a resting voltage and the FETs' resistance is very high, the active region is insulated preventing charge within the active region from draining. The new gate electrodes allow charges to be cleared from the active region when positive or negative voltage is applied to the gates thereby reducing the resistance of the FETs.

BRIEF SUMMARY OF THE INVENTION

An embodiment of the present invention is an organic semiconductor detector for detecting radiation comprising an organic conducting active region, an output electrode and a field effect semiconductor device. The field effect semiconductor device comprises a biasing voltage electrode and a gate electrode. The organic conducting active region is connected on one side to the field effect semiconductor device and is connected on another side to the output electrode.

In another embodiment of the present invention, the field effect semiconductor device further comprises a channel region and an insulation region. The biasing voltage electrode is connected to the channel region. The insulation region electrically insulates the gate electrode and the channel region.

In yet another embodiment of the present invention, the channel region is a Pentacene channel region and the insulation region is a Parylene insulation region.

In another embodiment of the present invention, the organic conducting active region, the output electrode, the gate electrode and the biasing voltage electrode are made of PEDOT layers deposited on a PEN substrate.

In yet another embodiment of the present invention, a voltage at the output electrode is held at a constant level when the organic semiconductor detector is not being irradiated.

In another embodiment of the present invention, the constant level is 2 volts.

In yet another embodiment of the present invention, the organic conducting active region becomes positively electrically charged when the organic semiconductor detector is being irradiated with ionizing radiation. The voltage at the output electrode increases above the constant level when the organic conducting active region becomes positively electrically charged.

In another embodiment of the present invention, a negative voltage applied to the gate electrode when the organic conducting active region becomes positively electrically charged drains the positive electrical charge of the organic conducting active region and returns the voltage at the output electrode to the constant level.

In yet another embodiment of the present invention, the organic semiconductor detector for detecting radiation is configured as a dosimeter. The organic conducting active region becomes positively electrically charged when the organic semiconductor device is being irradiated with ionizing radiation. A gate voltage is applied to the gate electrode while the organic semiconductor detector is being irradiated. The gate voltage is determined so as to maintain the voltage at the output electrode at the constant level when the organic semiconductor detector is being irradiated. The gate voltage is representative of a dose of ionizing radiation received by the organic conducting active region.

In another embodiment of the present invention, an organic semiconductor detector for detecting radiation comprises an organic conducting active region, an output electrode, a first field effect semiconductor device and a second field effect semiconductor device. The first field effect semiconductor device comprises a first biasing voltage electrode and a first gate electrode. The second field effect semiconductor device comprises a second biasing voltage electrode and a second gate electrode. The organic conducting active region is connected to the first field effect semiconductor device and to the second field effect semiconductor device. The organic conducting active region is connected to the output electrode.

In yet another embodiment of the present invention, the first field effect semiconductor device further comprises a first channel region and a first insulation region and the second field effect semiconductor device further comprises a second channel region and a second insulation region. The first bias voltage electrode is connected to the first channel region and the second bias voltage electrode is connected to the second channel region. The first insulation region electrically insulates the first gate electrode and the first channel region and the second insulation region electrically insulates the second gate electrode and the second channel region.

In another embodiment of the present invention, the first channel region and the second channel region are Pentacene channel regions and the first insulation region and the second insulation region are Parylene insulation regions.

In yet another embodiment of the present invention, the organic conducting active region, the output electrode, the first gate electrode, the second gate electrode, and the first biasing voltage electrode, and the second biasing voltage electrode are made of PEDOT layers deposited on a PEN substrate.

In another embodiment of the present invention, a voltage at the output electrode is held at a constant level when the organic semiconductor detector is not being irradiated.

In yet another embodiment of the present invention, a negative voltage applied to the first gate electrode drains a positive electrical charge of the organic conducting active region when the organic conducting active region becomes positively electrically charged and returns the voltage at the output electrode to the constant level. A negative voltage applied to the second gate electrode drains a negative electrical charge of the organic conducting active region when the organic conducting active region becomes negatively electrically charged and returns the voltage at the output electrode to the constant level.

BRIEF DESCRIPTION OF THE SEVERAL VIEWS OF THE DRAWING

The advantages and features of the present invention will be better understood as the following description is read in conjunction with the accompanying drawings, wherein.

Figure 1:
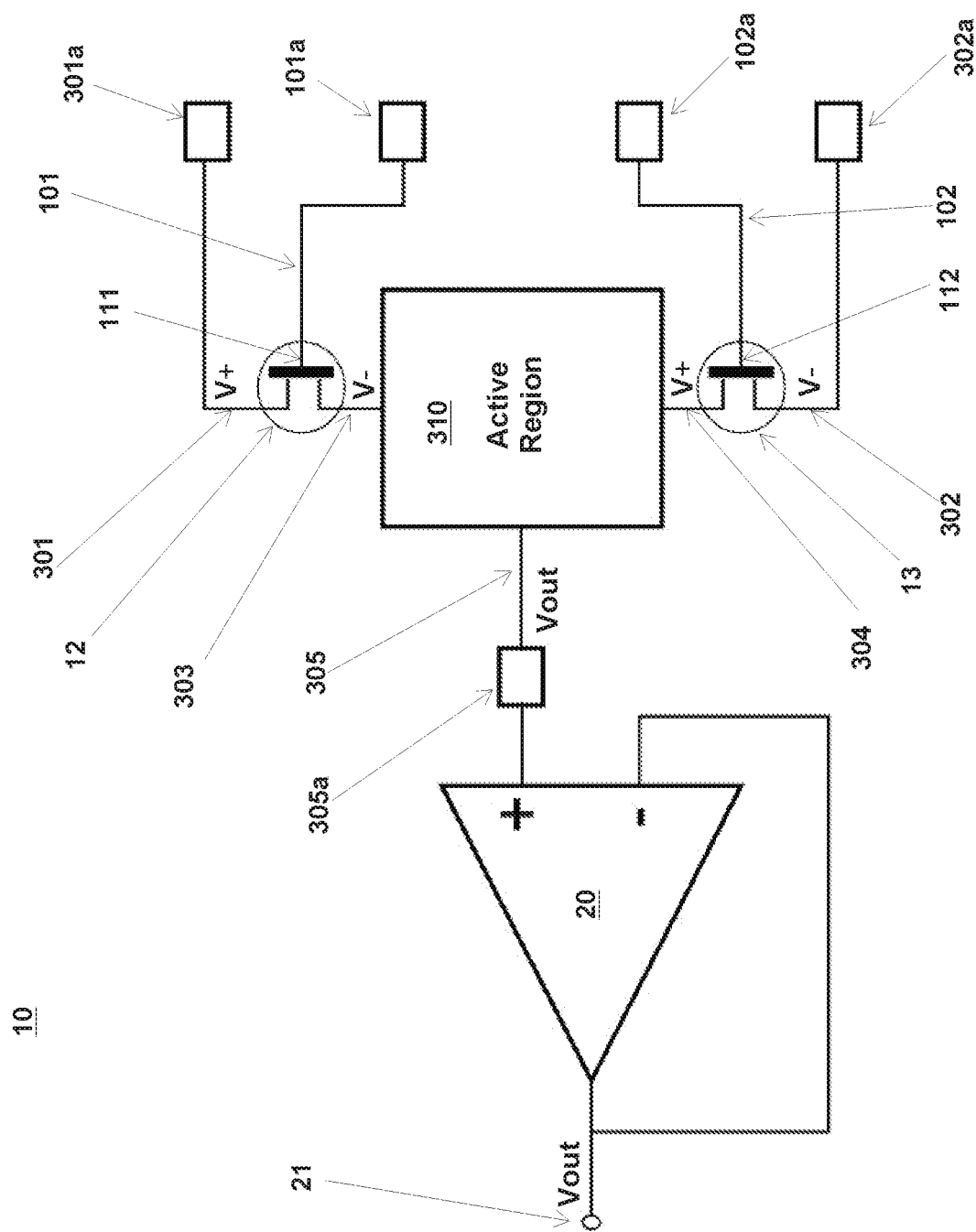
FIG. 1 is an illustration of an embodiment for the Solid State Tissue Equivalent Detector (SSTED).

For clarity purposes, all reference numerals may not be included in every figure.

DETAILED DESCRIPTION OF THE INVENTION

SSTEDs pursuant to the present invention are capable of measuring ionizing radiation using organic semiconductors. The devices are preferably fabricated on PEN (Polyethylene Naphthalate) substrates using the process described below. It is important to recognize that a large portion of the device which is exposed to radiation is constructed from organic material. This is a key feature, enabling the device to function as a tissue equivalent radiation detector. A material's radiation cross section is generally dependent on: (1) the atomic number of its constituent components, (2) the overall density of the material, and (3) the energy, character, characteristics, and/or quality of the incident ionizing radiation.

The atomic number of the constituent components of the materials used in the device is dictated by the chemical makeup of the material. The devices preferably are constructed from organic compounds to ensure that the atomic numbers and the relative proportions primarily match those of organic tissue. The atomic numbers of the constituent components for the device are selected so that the density of the active region is approximately the same density as the density of normal human tissue. The devices are primarily built from the same constituent components (e.g., Oxygen, Carbon, Hydrogen) as organic tissue with roughly the same density as material within a human cell. Consequently, from an ionizing radiation perspective, these devices have very similar radiation cross section as tissue, independent of the radiation energy and quality.

The SSTEDs pursuant to this invention respond appropriately to ionizing radiation of different qualities and energy. FIG. 1 shows a diagram of the structure of an embodiment of the SSTED. As illustrated in FIG. 1, the device 10 comprises two field effect semiconductor device regions 12 and 13 (for clarity referred to as FETs), each having a drain bias voltage electrode ("drain") (identified with V−) and a source bias voltage electrode ("source") (V+) and a gate electrode 111 or 112. The drain (V−) of FET 12 and the source (V+) of FET 13 are connected to an organic conducting active region ("Active Region") 310. The Gate 111 of FET 12 is connected via a gate connector 101 to an electrical contact 101a. The Gate 112 of FET 13 is connected via a gate connector 102 to an electrical contact 102a. The source (V+) of FET 12 is connected via a connector 301 to electrical contact 301a, and the drain (V−) of FET 13 is connected via a connector 302 to electrical contact 302a.

While FIG. 1 illustrates an embodiment with two field effect regions, the device can operate with a single field effect device region, for example FET 13. Adding a second field effect device region, e.g., FET 12, facilities in balancing the system, but is not required for operation, as will be understood by a person skilled in the art.

Also as illustrated on FIG. 1, the Active Region 310 is connected via a connector 305 to an electrical contact 305a. The electrical connector 305a is further connected to additional circuitry 20 comprising an Op-Amp with an output 21.

Figure 2:
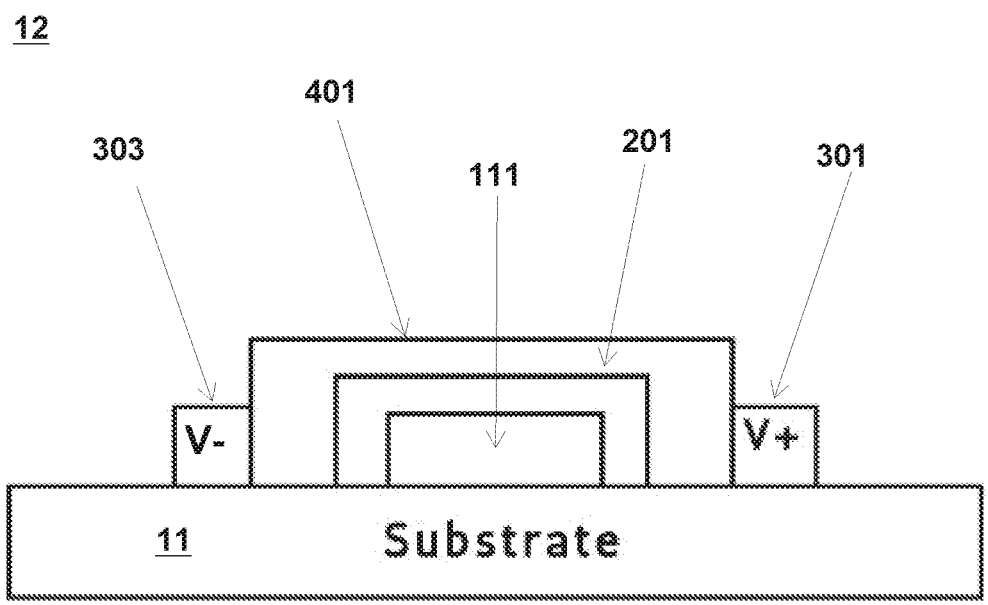
FIG. 2 is an illustration of a cross-section of an embodiment of the present invention.

FIG. 2 illustrates a cross section of FET 12. A cross section of FET 13 is the same and is not shown. FET 12 is formed on the substrate 11 by depositing layers of different materials, as described in more detail below. The FET 12 comprises a gate 111, insulation 201, channel 401, source 302 electrode, and drain 301 electrode. Insulation 201 insulates the gate electrode 111 and the gate connector 101 of the FET 12 from the rest of the FET structure so that the application of a gate voltage to the gate connector 101 (or electrical contact 101a) does not cause current to run within the rest of the FET structure, thereby creating the "field effect" in the FET structure.

The device 10 may be manufactured by printing or depositing layers of different materials on a substrate 11, preferably made of PEN. In this embodiment the first layer deposited on the substrate 11 is composed of a conducting polymer, preferably PEDOT (Poly(3,4-ethylenedioxythiophene)) and forms the gate electrodes 111, 112, the gate connectors, 101, 102, and electrical contacts 101a, 102a. The second layer is composed of a non-conducting polymer, preferably Parylene, and is deposited only in the region of the gate electrodes 111, 112 of the FET 12, 13. The second layer forms the insulation 201 (FIG. 2). The third layer deposited on the substrate is composed of a conducting polymer, preferably PEDOT. The third layer forms the Active Region 310, the output connection 305 and connector 305a. The third layer also forms the source 301, 303 and drain 302, 304 connectors of FETs 12, 13, and the electrical connectors 301a, 302a. The fourth layer is composed of high mobility organic semiconductor, preferably TIPS pentacene (6,13-Bis(triisopropylsilylethynyl) and forms the channel regions 401 of the FETs 12, 13. TIPS pentacene is a relatively high mobility organic semiconductor that is well suited for FET construction. It is also a reasonably good photoconductor, and this is exploited when the SSTEDs undergo testing of the devices structural integrity.

Within the device 10 a large portion of the third layer serves as the Active Region 310. The Active Region 310 has substantially larger volume (e.g., 50-200, or more, times larger) than any other feature or component within the device 10. This substantially larger volume can be achieved by increasing the area and/or thickness of the material forming Active region 310. The Active Region 310 becomes charged when the device is irradiated with ionizing radiation. The embodiment of device 10 illustrated in FIG. 1 includes a biasing amplifier 20. FETs 12, 13 are extremely high resistance when a positive or ground voltage is applied to the gate electrodes 111, 112, for example via the gate connectors, 101, 102, and contacts 101a, 102a.

Under these bias voltage conditions FETs 12, 13 act as resistors with resistances in the Giga Ohm (GΩ) range. The FETs 12, 13 therefore form a voltage divider and the voltage (Vout) at contact 305a measured between the points 303 and 304 where the FET pair is connected to the Active Region 310 can be held at a constant voltage at rest (e.g., when the device is not irradiated) ("resting voltage"). Assuming the device 10 comprises two FETs, and the FETs have equal resistances, the resting voltage can be approximately (V+−V−)/2. The voltages V+ and V− can also be adjusted so that at rest the Active Region 310 is held at different resting voltage, as measured at Vout at contact 305a. The value for the resting voltage is chosen to lie within the operating characteristics of the operational amplifier 20 used for the device 10, while taking into consideration the overall noise in the system, and the characteristics of the other components in the system. For example, if the max voltage of op-amp 20 is 4.5V, the resting voltage can be between 0V and 4.5V, but preferably will be closer to the middle of this range, around 2V. With other types of amplifiers the resting voltage can have different values.

The operational amplifier ("op-amp") 20 preferably is a femto-ampere input bias precision amplifier and is chosen so that it can sense small charge accumulations in the Active Region 310 without affecting the measurement. Such op-amps are typically used for electrometer measurements like the ones being described herein. For example, Texas Instruments LMP7721MA, or similar op-amps can be used. The op-amp 20 is configured as a voltage follower, isolating the Active Region 310 from downstream electronics. This isolation is required because the charge buildup in the Active Region 310 due to irradiation is small and any charge from other electronics leaking to the Active Region 310 will adversely affect the measurement. In the initial or un-exposed state the Active Region 310 is nominally held at the resting voltage (as described above). The voltage follower configuration of op-amp 20 does not provide any gain, and as a result the voltage at contact 21 will nominally be the same as the voltage at contact 305a, in both contacts represented by Vout in FIG. 1. Because FETs 12, 13 are extremely high resistance (e.g., in the GΩ range) effectively insulating the Active Region 310, the Active Region 310 essentially is held at the resting voltage but is "free standing." By "free standing" it is meant that the Active Region 310 is primarily connected to the op-amp 20 and isolated from everything else.

When the device 10 is irradiated with ionizing radiation the Active Region 310 becomes ionized as electrons are driven out of the Active Region 310. The Active Region 310 thus becomes more positively charged and the value of Vout at connector 305, and at connector 21 will increase above the resting voltage. Because the input impedance of the op-amp 20 and the resistance of the FETs 12, 13 are very high, there is very insignificant conduction path to bring the voltage in the Active Region 310 back to the resting voltage. The insignificant conduction through the FET 12, 13 will drain the charge of the Active Region 310 (or equalize the charge) over a long period of time. To speed up the draining of the charge from the Active Region 310 a negative voltage can be applied to the gate electrode 112 of FET 13. Applying negative voltage to gate connector 102, which is connected to gate electrode 112, will reduce the resistance of FET 13 and allow conduction through FET 13 to drain the positive charge from the Active Region 310 and restore the Active Region 310 to the resting voltage.

In a situation when the Active Region 310 is negatively charged, it can be returned to resting voltage by applying negative voltage to gate electrode 111 of FET 12. While the device 10 is at rest positive voltage may also be applied to gate electrodes 111 and 112 to increase the charge and increase the resistance of FETs 12, 13. Control of the gate is managed by a separate control board that in this embodiment is Arduino based, but maybe any other suitable electronics control board known in the art.

Figure 3:
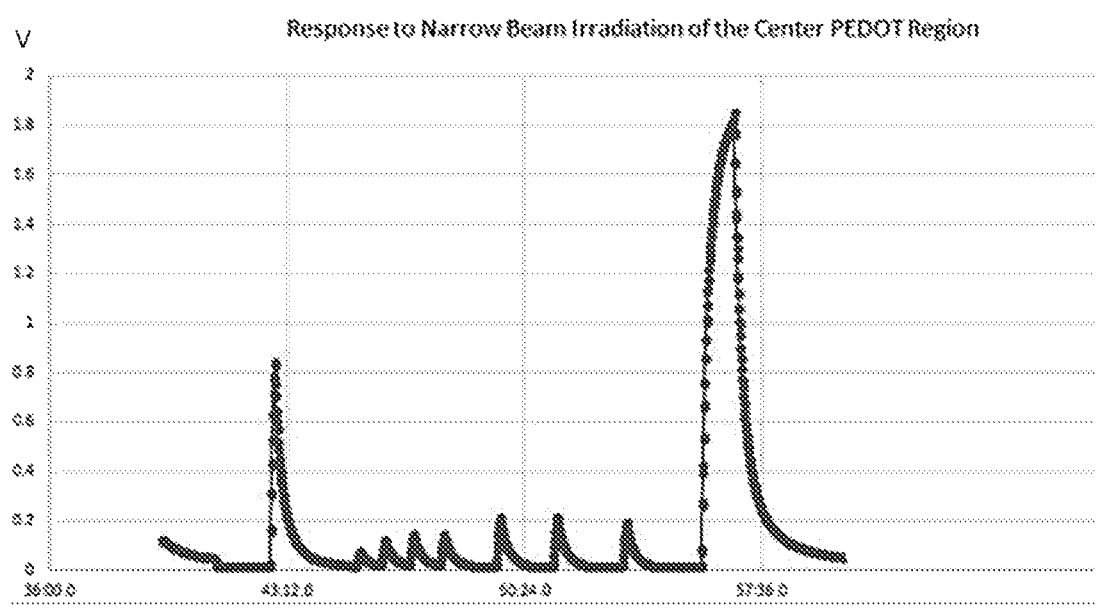
FIG. 3 is a graphical illustration of the response of an embodiment of the present invention to microbeam radiation.

FIG. 3 shows a test response of an SSTED embodiment of this invention to a 300 μm wide beam of 40 kV X-rays irradiating the center of the Active Region 310. For the test the beam was produced by X-ray Diffraction (XRD) crystallography apparatus. The X-ray tube voltage and current can be adjusted, and the exposure time is always 5 seconds in the figure. The "0" value of the Y axis represents resting voltage, and the Y-axis shows volts above the resting voltage measured at Vout, and the X-axis shows time in minutes and seconds. Each peak on the graph of FIG. 3 coincides with X-Ray exposure of the Active Region 310 of device 10. FIG. 3 shows nine peaks corresponding to nine periods of X-Ray exposure of the Active Region 310. As FIG. 3 illustrates, at each peak different maximum voltages above resting voltage were registered, corresponding to different intensities of X-Ray radiation.

The tail after each peak on FIG. 3 indicates the time it takes to bring the Active Region 310 back to resting voltage by applying voltage to the gate electrode 112 of FET 13. In this experiment a small bias voltage was applied to gate electrode 112 via gate connector 102 and contact 102a. A different implementation of a biasing mechanism would be to hold the output voltage Vout constant by applying a feedback voltage from output connector 21 or 305a to gate connector 102 and varying the voltage applied at gate connector 102 depending on the value of the feedback voltage. The voltage thus applied at gate electrode 112 (e.g., via gate connector 102, contact 102a) to maintain a constant Vout would be representative of the intensity of the ionizing radiation and can be used as an effective dosimeter output. The SSTEDs have been probed with the 300 μm microbeam across the entire surface of the device. This is an extremely important measurement if the device is to be truly tissue equivalent. When materials are exposed to ionizing radiation, they naturally become charged. It is necessary for us to only measure the contribution from organic regions of the device. The contributions from other regions of the device are found to negligible, proving that the response to ionizing radiation will mainly arise from charge generation within the Active Region 310.

While the invention has been described with reference to exemplary embodiments, it will be understood by those skilled in the art that various changes, omissions, and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiments disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. An organic semiconductor detector for detecting ionizing radiation comprising:
   an organic conducting active region;
   an output electrode made of conductive organic material; and
   an organic field effect semiconductor device comprising a biasing voltage electrode made of conductive organic material and a gate electrode made of conductive organic material;
   wherein the organic conducting active region is connected on one side to the organic field effect semiconductor device; and,
   wherein the organic conducting active region is connected on another side to the output electrode.

2. The organic semiconductor detector for detecting ionizing radiation of claim 1, wherein the organic field effect semiconductor device further comprises an organic channel region and an organic insulation region;
   wherein the biasing voltage electrode is connected to the organic channel region; and,
   wherein the organic insulation region electrically insulates the gate electrode and the organic channel region.

3. The organic semiconductor detector for detecting ionizing radiation of claim 2, wherein the organic channel region is a Pentacene channel region; and,
   wherein the organic insulation region is a Parylene insulation region.

4. The organic semiconductor detector for detecting ionizing radiation of claim 2,
   wherein the organic semiconductor detector is a human tissue equivalent detector for detecting ionizing radiation.

5. The organic semiconductor detector for detecting ionizing radiation of claim 2,
   wherein the organic semiconductor detector has an ionizing radiation cross section equivalent to human tissue.

6. The organic semiconductor detector for detecting ionizing radiation of claim 2,
   wherein the ionizing radiation is radiation that drives electrons out of an organic material when the organic material is irradiated with the ionizing radiation; and,
   wherein the organic material becomes ionized when the organic material is irradiated with the ionizing radiation.

7. The organic semiconductor detector for detecting ionizing radiation of claim 6, wherein the ionizing radiation comprises one or more of photons with energy higher than 10 eV, neutrons, and protons.

8. The organic semiconductor detector for detecting ionizing radiation of claim 1, wherein the organic conducting active region, the output electrode, the gate electrode and the biasing voltage electrode are made of PEDOT layers deposited on a PEN substrate.

9. The organic semiconductor detector for detecting ionizing radiation of claim 1, wherein a voltage at the output electrode is held at a constant level when the organic semiconductor detector is not being irradiated.

10. The organic semiconductor detector for detecting ionizing radiation of claim 9, wherein the organic conducting active region becomes positively electrically charged when the organic semiconductor detector is being irradiated with ionizing radiation; and,
    wherein the voltage at the output electrode increases above the constant level when the organic conducting active region becomes positively electrically charged.

11. The organic semiconductor detector for detecting ionizing radiation of claim 10, wherein a negative voltage applied to the gate electrode when the organic conducting active region becomes positively electrically charged drains the positive electrical charge of the organic conducting active region and returns the voltage at the output electrode to the constant level.

12. The organic semiconductor detector for detecting ionizing radiation of claim 10 wherein the ionizing radiation comprises one or more of photons with energy higher than 10 eV, neutrons, and protons.

13. The organic semiconductor detector for detecting ionizing radiation of claim 9 is configured as a dosimeter, wherein the organic conducting active region becomes positively electrically charged when the organic semiconductor device is being irradiated with ionizing radiation;
    wherein a gate voltage is applied to the gate electrode while the organic semiconductor detector is being irradiated;
    wherein the gate voltage is determined so as to maintain the voltage at the output electrode at the constant level when the organic semiconductor detector is being irradiated; and,
    wherein the gate voltage is representative of a dose of ionizing radiation received by the organic conducting active region.

14. An organic semiconductor detector for detecting radiation comprising:
    an organic conducting active region;
    an output electrode made of conductive organic material;
    a first organic field effect semiconductor device comprising a first organic biasing voltage electrode and a first organic gate electrode; and,
    a second organic field effect semiconductor device comprising a second organic biasing voltage electrode and a second organic gate electrode;
    wherein the organic conducting active region is connected to the first organic field effect semiconductor device and to the second organic field effect semiconductor device;
    wherein the organic conducting active region is connected to the output electrode;
    wherein the organic semiconductor detector detects ionizing radiation;
    wherein the ionizing radiation is radiation that drives electrons out of an organic material when the organic material is irradiated with the ionizing radiation; and
    wherein the organic material becomes ionized when the organic material is irradiated with the ionizing radiation.

15. The organic semiconductor detector for detecting radiation of claim 14, wherein the first organic field effect semiconductor device further comprises a first organic channel region and a first organic insulation region and the second organic field effect semiconductor device further comprises a second organic channel region and a second organic insulation region;

wherein the first bias voltage electrode is connected to the first organic channel region and the second bias voltage electrode is connected to the second organic channel region; and, wherein the first organic insulation region electrically insulates the first organic gate electrode and the first organic channel region and the second organic insulation region electrically insulates the second organic gate electrode and the second organic channel region.

16. The organic semiconductor detector for detecting radiation of claim 15, wherein the first organic channel region and the second organic channel region are Pentacene channel regions and the first organic insulation region and the second organic insulation region are Parylene insulation regions.

17. The organic semiconductor detector for detecting radiation of claim 14, wherein the organic conducting active region, the output electrode, the first organic gate electrode, the second organic gate electrode, the first organic biasing voltage electrode, and the second organic biasing voltage electrode are made of PEDOT layers deposited on a PEN substrate.

18. The organic semiconductor detector for detecting radiation of claim 14, wherein a voltage at the output electrode is held at a constant level when the organic semiconductor detector is not being irradiated; and wherein the voltage at the output electrode increases above the constant level when the organic conducting active region becomes ionized as a result of being irradiated with ionizing radiation.

19. The organic semiconductor detector for detecting radiation of claim 18, wherein a negative voltage applied to the first organic gate electrode drains a positive electrical charge of the organic conducting active region when the organic conducting active region becomes positively electrically charged and returns the voltage at the output electrode to the constant level; and, wherein a negative voltage applied to the second organic gate electrode drains a negative electrical charge of the organic conducting active region when the organic conducting active region becomes negatively electrically charged and returns the voltage at the output electrode to the constant level.

20. The organic semiconductor detector for detecting ionizing radiation of claim 14, wherein the organic semiconductor detector is a human tissue equivalent detector for detecting ionizing radiation.

21. The organic semiconductor detector for detecting ionizing radiation of claim 14, wherein the organic semiconductor detector has an ionizing radiation cross section equivalent to human tissue.

22. The organic semiconductor detector for detecting ionizing radiation of claim 14 wherein the ionizing radiation comprises one or more of photons with energy higher than 10 eV, neutrons, and protons.

* * * * *